United States Patent [19]

Victor et al.

[11] Patent Number: 4,551,856
[45] Date of Patent: Nov. 5, 1985

[54] SYNTHESIZED MULTIPLE CONVERSION RECEIVER SYSTEM WITH PROVISION FOR AVOIDING RECEIVER SELF-QUIETING SPURIOUS RESPONSE

[75] Inventors: Alan M. Victor, Cooper City; Darrell E. Davis, Sunrise, both of Fla.

[73] Assignee: Motorola, Inc., Schaumburg, Ill.

[21] Appl. No.: 495,308

[22] Filed: May 16, 1983

[51] Int. Cl.⁴ ............................ H04B 1/16; H03J 7/18
[52] U.S. Cl. .................................... 455/183; 455/165; 455/186; 455/316
[58] Field of Search ................. 455/76, 165, 183, 185, 455/186, 314–316; 331/2, 18, 22

[56] References Cited

U.S. PATENT DOCUMENTS

| | | |
|---|---|---|
| 3,372,339 | 3/1968 | Harrison et al. |
| 3,414,821 | 12/1968 | Bickers et al. |
| 4,063,173 | 12/1977 | Nelson et al. |
| 4,152,669 | 5/1979 | Igarashi |
| 4,198,604 | 4/1980 | Holdaway |
| 4,322,856 | 3/1982 | Ohta et al. ........................ 455/315 |
| 4,340,974 | 7/1982 | Cooke et al. |
| 4,395,777 | 7/1983 | Oki et al. ............................ 455/316 |

FOREIGN PATENT DOCUMENTS

| | | | |
|---|---|---|---|
| 12129 | 2/1981 | Japan | 455/165 |
| 69927 | 4/1982 | Japan | 455/165 |

OTHER PUBLICATIONS

New Products "Synthesized Communications Receiver", Wireless World, 12/1977, vol. 83, No. 1504.

Primary Examiner—Jin F. Ng
Attorney, Agent, or Firm—Joseph T. Downey; Daniel K. Nichols; Edward M. Roney

[57] ABSTRACT

A multiple conversion superheterodyne receiver system includes a first frequency synthesizer capable of generating any one of a number of predetermined first local oscillator frequencies for mixing with an incoming signal to produce a first intermediate frequency. A second frequency synthesizer selectively generates any one of two local oscillator frequencies corresponding to either high side or low side injection to be mixed with first intermediate frequency producing an appropriate second intermediate frequency. A frequency selecting circuit is operatively coupled to the first and second frequency synthesizer for selecting an appropriate one of the first local oscillator frequencies to tune the receiver to a desired channel and for selecting an appropriate one of the second local oscillator frequencies for avoiding receiver self-quieting spurious responses.

12 Claims, 6 Drawing Figures

SYNTHESIZED MULTIPLE CONVERSION RECEIVER SYSTEM WITH PROVISION FOR AVOIDING RECEIVER SELF-QUIETING SPURIOUS RESPONSE

BACKGROUND OF THE INVENTION

1. Field of the Invention

This invention relates generally to the field of multiple conversion superheterodyne receiver systems and the elimination of self-quieting spurious responses therein. More particularly, this invention relates to a ROM programmed frequency synthesized multiple conversion receiver system for improving receiver frequency stability and eliminating receiver self-quieting spurious responses via phase-locked oscillators.

2. Background of the Invention

The receiver system designer is frequently confronted with two serious problems when designing a multiple conversion superheterodyne receiver which must receive a wide range of radio frequency inputs. The first such problem is known as receiver self-quieting spurious responses while the second problem is that of receiver frequency stability. For wideband receivers the frequency stability problem is compounded by the requirement for high intermediate frequencies in such wideband receivers.

The receiver self-quieting phenomenom is caused by harmonics of the receiver's local oscillators mixing together in any of the non-linear stages of the receiver to produce a frequency which the receiver is capable of responding to as though it were an incoming or intermediate frequency signal. This receiver self-quieting phenomenom is prehaps best understood by first examining the phenomenom in a conventional dual conversion superheterodyne receiver such as the one shown in FIG. 1. In this system an RF frequency input $F_{RF}$ first enters input 10 of the receiver's RF stages 15. These RF stages 15 may include amplification, matching, filtering networks, etc. as required by the system. In general, substantially the same RF frequency $F_{RF}$ will exit an output 20 of RF stages 15 and enter an input 25 of a first mixer 30.

Figures 1, 2:
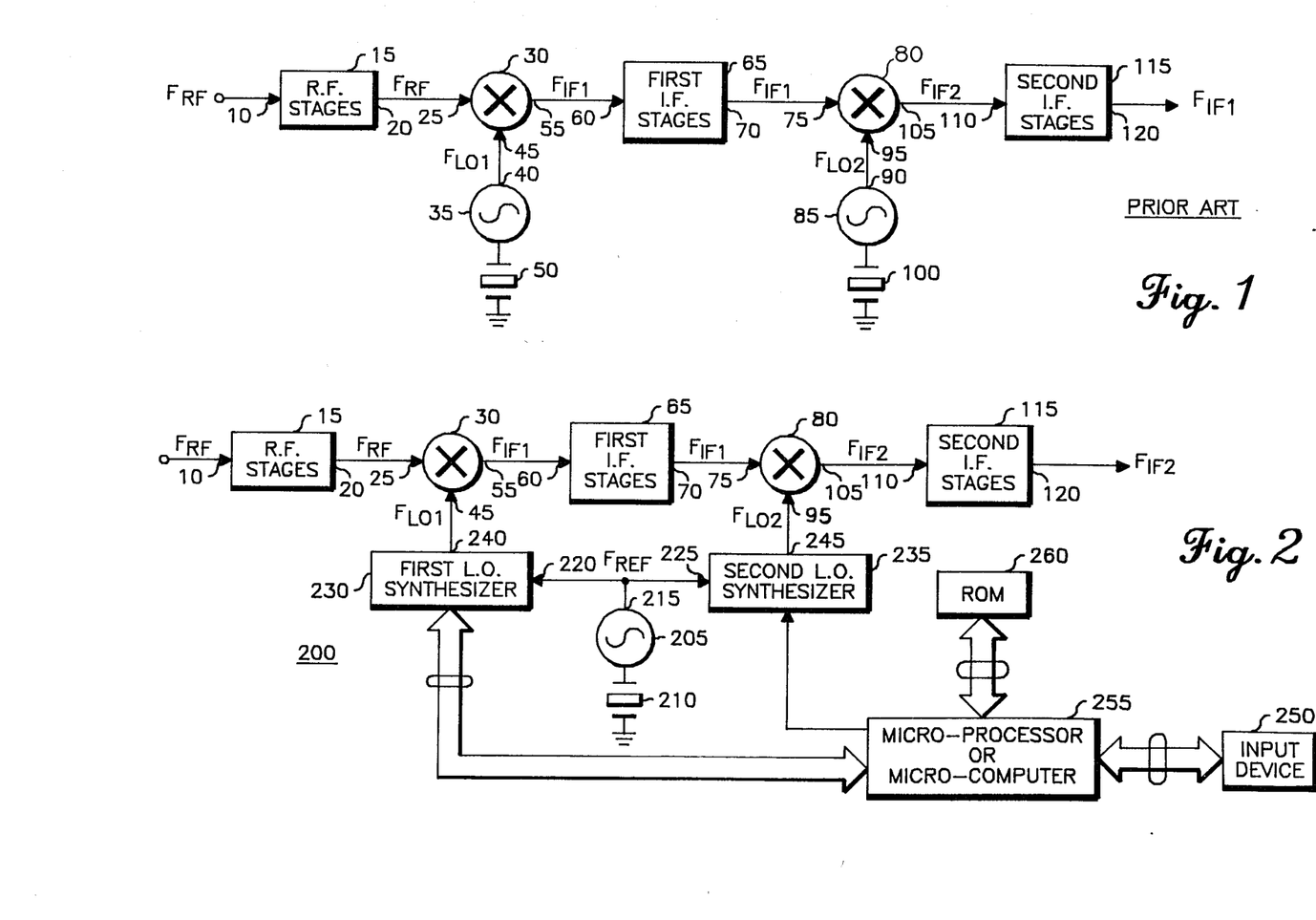
FIG. 1 is a system diagram of a conventional prior art dual conversion receiver system.
FIG. 2 shows a system block diagram of one embodiment of the receiver system of the present invention.

A first local oscillator frequency $F_{LO1}$ is produced by a first local oscillator 35 having an output 40 operatively coupled to a second input 45 of first mixer 30. Oscillator 35 may be a conventional crystal controlled oscillator whose frequency is determined by a crystal 50. This oscillator crystal may be one of many such crystals which may be selectively coupled to oscillator 35 in order to provide the user with a plurality of receiver channels. Alternatively, oscillator 35 may be a frequency synthesizer which may generate any number of frequencies via frequency synthesis in order to provide the user with a plurality of receiver channels.

As is well known in the art, first mixer 30 will produce an output intermediate frequency $F_{IF1}$ on output terminal 55 in accordance with the equation $F_{RF} - F_{LO1} = F_{IF1}$ if the system uses low side injection to the first mixer or $F_{IF1} = F_{LO1} - F_{RF}$ if the system utilizes high side injection at first mixer 30.

This first intermediate frequency $F_{IF1}$ is applied to an input 60 of first I.F. stages 65. First I.F. stages 65 may include amplifiers and filters for processing the intermediate frequency signal $F_{IF1}$ as necessary. In the preferred embodiment first I.F. stages 65 includes a narrow-band crystal filter.

An output 70 of the first I.F. stages 65 is operatively coupled to an input 75 of a second mixer 80 thereby applying $F_{IF1}$ thereto. A second local oscillator 85 provides a second local oscillator frequency $F_{LO2}$ at an output 90 to be applied to an input 95 of second mixer 80. Oscillator 85 is generally a fixed frequency oscillator having frequency $F_{LO2}$ determined by a single oscillator crystal 100.

A second intermediate frequency appears at an output 105 of mixer 80 and has frequency designated $F_{IF2}$. The second local oscillator frequency $F_{LO1}$ is determined in accordance with the equation $F_{IF2} = F_{IF1} - F_{LO2}$ if low side injection is utilized for the second mixer and $F_{LO2} - F_{IF1} = F_{IF2}$ if high side injection is utilized for the second mixer.

This second I.F. frequency $F_{IF2}$ is applied to an input 100 of second I.F. stages 115 where the signal is further processed and appears at an output 120 of the second I.F. stages. At this point the signal is further processed by other circuitry as deemed necessary in accordance with the systems specifications and requirements. Most frequently output 120 will drive a demodulator such as a frequency modulation (FM) discriminator.

It is often the case that the second I.F. stages 115 are utilized to obtain large quantities of gain at the second I.F. frequency $F_{IF2}$. It is not atypical for second I.F. stages 115 to include amplifiers having gains in excess of 120 db. Since the second I.F. frequency $F_{IF2}$ is the lowest intermediate frequency in a dual conversion receiver system it is most economical and advantageous to utilize the second I.F. stages 115 to obtain the majority of the system gain and selectivity.

As stated earlier, the receiver self-quieting phenomenom is the result of harmonics of the first oscillator frequency $F_{LO1}$ mixing in any non-linear stage of the receiver with harmonics of the second oscillator frequency $F_{LO2}$ in a manner which produces either the first I.F. frequency $F_{IF1}$ or more frequently the second I.F. frequency $F_{IF2}$. When the first and second local oscillator frequencies $F_{LO1}$ and $F_{LO2}$ respectively are inadvertently selected to satisfy this condition the result is frequently the presence of a signal in the radio which causes the receiver to respond as though it is receiving an incoming message. In an FM system this can result in the receiver "capturing" itself while ignoring an incoming signal. This condition is known as receiver self-quieting. It is important to note, however, that this phenomenom occurs totally independent of any input signal at frequency $F_{RF}$. In other words, if the equation $(J \times F_{LO1}) \pm (K \times F_{LO2}) = \pm F_{IF1}$ or $\pm F_{IF2}$, where J and K are positive integers, the receiver will respond as though it is receiving an incoming radio frequency signal. One skilled in the art will readily appreciate that even a very small signal level traveling along supply lines, ground lines or signal paths when amplified in the second I.F. stages can severely interfere with proper receiver operation.

By way of an example of this phenomenom, assume that the receiver of FIG. 1 is designed to respond to a signal of 154.585 MHz, has a first I.F. frequency of $F_{IF1} = 10.700$ MHz, a second I.F. frequency of 455 KHz, and a first local oscillator frequency $F_{LO1}$ of 143.885 MHz. For such a receiver to function properly, two possible second local oscillator frequencies $F_{LO2}$ may be utilized: 10.245 MHz (low-side injection) or 11.155 MHz (high side injection). If 10.245 MHz is selected a self-quieting spur occurs as a result of the first harmonic of the first local oscillator frequency mixing with the 14th harmonic of the second local oscillator frequency. In this example, $(1\times F_{LO1})-(14\times F_{LO2})=455$ KHz. Even though the 14th harmonic of the second local oscillator frequency would presummably be a very small signal, this combination would still be likely to cause severe receiver problems due to the high gain of the second I.F. stages. This is especially true for portable (handheld) receivers or transceivers due to packaging considerations, since in portable equipment, size and weight considerations severely limit the amount of shielding and bypassing which can be implemented to help combat such problems.

In the above example, the low-side injection frequency caused a self-quieting condition to be present. If the high-side injection frequency (11.155 MHz) is utilized no such self-quieting phenomenom occurs. Therefore, one solution to this problem would be to change the second oscillator crystal to 11.155 MHz and readjust the second oscillator accordingly to obtain high-side injection. However, it is not always the case that high-side injection is free of self-quieting problems. Many other frequency combinations can be generated which cause self-quieting in a high-side injection receiver system.

To extend the above example somewhat, assume it is also desirable to receive 156.170 MHz on the same receiver. For this particular frequency the first local oscillator frequency is switched to 145.470 MHz. Note however that the first harmonic of 145.470 MHz can mix with the 13th harmonic of 11.155 MHz to obtain the second I.F. frequency of 455 KHz. That is, $(1\times F_{LO1})-(13\times F_{LO2})=F_{IF2}$. This set of receive frequencies cannot be properly received on this particular receiver without extreme modifications such as modifying the first or second I.F. frequencies. It is clear, therefore, that there are sets of receiver frequencies which are mutually incompatible in a conventional dual conversion receiver system such as that shown in FIG. 1. It is apparent that the potential user could find himself in the situation of desiring a receiver which may be utilized to receive two channels which his receiver cannot properly process because of self-quieting.

The second problem addressed by this invention is that of receiver frequency stability. For the system of FIG. 1 the first and second oscillators' drift with ambient temperature changes etc., results in receiver performance degradation at the temperature extremes. This is particularly true if the receiver is designed to function over a wide band of input frequencies since this condition necessitates a higher than conventional first intermediate frequency $F_{IF1}$. These conditions in turn necessitate a higher than conventional second local oscillator frequency $F_{LO2}$. As the second local oscillator frequency $F_{LO2}$ rises, its contribution to the overall frequency stability of the receiver increases. This necessitates more complex and expensive second local oscillator designs possibly utilizing extremely high stability and costly crystals.

SUMMARY OF THE INVENTION

It is an object of the present invention to provide an improved multiple conversion receiver system.

It is another object of the present invention to provide an improved multiple converstion receiver system having the capability of eliminating self-quieting spurious responses.

It is another object of the present invention to provide a multiple conversion receiver system having improved frequency stability.

It is another object of the present invention to provide a method of programming a ROM for an improved frequency synthesizer.

It is a further object of the present invention to provide a multiple conversion synthesized receiver system having improved receiver frequency stability and which eliminates the problem of receiver self-quieting spurious responses.

These and other objects of the invention will become apparent to those skilled in the art upon consideration of the following description of the invention.

In accordance with one embodiment of the present invention, a multiple conversion superheterodyne receiver system includes a first local oscillator for selectively generating any one of a plurality of predetermined first local oscillator frequencies to be mixed with an incoming signal to produce a first intermediate frequency. A second local oscillator selectively generates any one of two second local oscillator frequencies to be mixed with the first intermediate frequency thereby producing an appropriate second I.F. frequency. A frequency selecting circuit is operatively coupled to the first and second local oscillators for selecting one of the first local oscillator frequencies to tune the receiver to a desired channel and for selecting an appropriate one of the second local oscillator frequencies for avoiding self-quieting spurious responses in the receiver system.

In one embodiment of a method of programming a ROM for a frequency synthesizer such method includes searching for receiver self-quieting spurious responses in a desired receiver frequency, selecting a second local oscillator frequency to avoid receiver self-quieting, and encoding the ROM with a second local oscillator frequency determining bit.

The features of the invention belived to be novel are set forth with particularity in the appended claims. The invention itself however, both as to organization and method of operation, together with further objects and advantages thereof, may be best understood by reference to the following description taken in conjunction with the accompanying drawings.

DESCRIPTION OF THE PREFERRED EMBODIMENT

In one embodiment of the present invention, the above-stated objectives may be satisfied in a system such as receiver system 200 of FIG. 2. In this system receiver building blocks 15, 30, 65, 80, and 115 are substantially similar to those of FIG. 1 and may perform similar functions. In accordance with this embodiment, a single high stability reference oscillator 205 whose frequency may be carefully controlled by a crystal 210 provides a reference frequency output $F_{REF}$ at an output terminal 215. This reference frequency is provided to inputs 220 and 225 of a first local oscillator synthesizer 230 and a second local oscillator 235 respectively so that only one costly crystal is needed. Due to the reduced signal-to-noise ratio requirements of the preferred embodiment, the second oscillator may be readily synthesized without adverse effect on system performance. The first local oscillator synthesizer 230 provides frequency $F_{LO1}$ via its output 240 to first mixer input 45 while second local oscillator synthesizer 235 provides the second local oscillator frequency $F_{LO2}$ via its output 245 to input 95 of the second mixer 80.

The use of synthesizers as shown for both the first and second local oscillators reduces the number of quartz crystal oscillators to a minimum. This in turn reduces cost and improves mechanical integrity since quartz crystals are costly and fragile. Also, substantial size reductions can be made since crystals are often bulky and require a great deal of mechanical reinforcement and shock isolation.

In one embodiment of the present invention, an input device 250 such as a rotary switch, a touch tone type keypad, thumb-wheel switches, etc. may be utilized by the user to program his receiver to a particular receive frequency. In one embodiment, this may be done by entering a code number into the input device which corresponds to a particular received channel. In yet another embodiment, the frequency itself may be directly entered. A microprocessor or microcomputer 255 reads the information from the input device and determines to which channel the user intends to set his receiver.

Once microprocessor 255 decodes which frequency the user intends to address, it may execute commands to program the dividers for the first local oscillator synthesizer to that exact frequency, and execute commands to program the dividers for the second local oscillator synthesizer to one of the two possible second local oscillator frequencies which will result in no self-quieting problem. It should be noted that since there are only two possible frequencies for the second local oscillator in the present embodiment, only a single bit of binary information is necessary to select the appropriate second oscillator frequency. For example, a binary digit 1 might represent high side injection while a binary digit 0 might represent low side injection. It will be evident to one skilled in the art that a number of bits of binary information are probably necessary to program the first local synthesizer to an appropriate frequency. The exact number will depend upon the synthesizer design and the number of addressable channels. This is particularly true for a wideband frequency synthesizer capable of receiving many channels.

In one embodiment of the present invention when microprocessor 255 receives an input from input device 50 it addresses a ROM 260 in order to determine exactly how to program first and second local oscillator synthesizers 230 and 235 respectively. If, for example, the present receiver is capable of receiving 64 independent frequencies, the user may be required to input a two digit code into input device 250 such as "1–5" to indicate that he wishes to receive "channel 15". Microprocessor 255 will then interrogate ROM 260 at an addressable location which corresponds to "channel 15" and retrieve a set of binary digits which it would decode and direct to first local oscillator synthesizer 230 to program it appropriately. If the receiver system is capable of 64 channels, a total of 6 or more parallel (or serial) bits of binary information may be necessary to program first local oscillator synthesizer 230. Since second local oscillator synthesizer 235 has only two possible frequencies, only a single bit of information is necessary to program it.

In another embodiment of the present invention ROM 260 may directly program the first local oscillator synthesizer 230 and the second local oscillator synthesizer 235 after being addressed by microprocessor 255. It will be readily apparent to one skilled in the art that many permutations of synthesizer programming techniques may be utilized to accomplish the above and those presented herein are merely illustrative.

Figure 3:
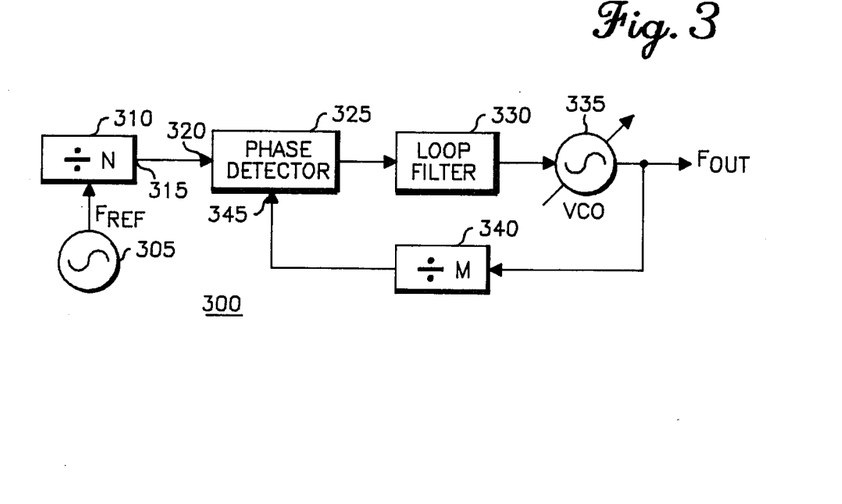
FIG. 3 shows a block diagram of a phase locked loop frequency synthesizer.

Turning now to FIG. 3 a basic phase-locked loop (PLL) frequency synthesizer is shown as synthesizer 300. This type of frequency synthesizer is well known in the art and includes a reference oscillator 305 which generates a reference frequency $F_{REF}$. This reference frequency $F_{REF}$ is applied to the input of a divider 310. Divider 310 divides the frequency $F_{REF}$ by some predetermined divisor N. Therefore, at the output 315 of divider 310 a signal having fundamental frequency $F_{REF}/N$ is present.

This signal appears at an input 320 of a phase detector 325. The output of phase detector 325 is filtered by a loop filter 330 prior to entering the control input of a voltage controlled oscillator 335. The signal at the output of VCO 335 is divided by a second frequency divider 340 which divides its incoming frequency by an integer M. The output of frequency divider 340 is provided to a second input 345 of phase detector 325. As is well known by those skilled in the art, the output of frequency synthesizer 300 is taken at the output of the voltage controlled oscillator 335 (input of second frequency divider 340). This output frequency $F_{OUT} = F_{REF} \times M/N$. Therefore, frequency synthesizer 300 may be utilized to generate any frequency which may be represented by the reference frequency $F_{REF}$ multiplied by a fraction whose numerator and denominator are both integers.

One skilled in the art will immediately recognize that due to the fundamental integer/fraction relationship between input and output frequencies in a frequency synthesizer, selection of I.F. frequencies, local oscillator frequencies, reference frequency, and receiver channel spacing are all intimately related. The selection of these parameters is therefore essential to the proper utilization of the present invention. It is evident that many combinations of the above frequencies are possible in utilizing the present invention.

Figure 4:
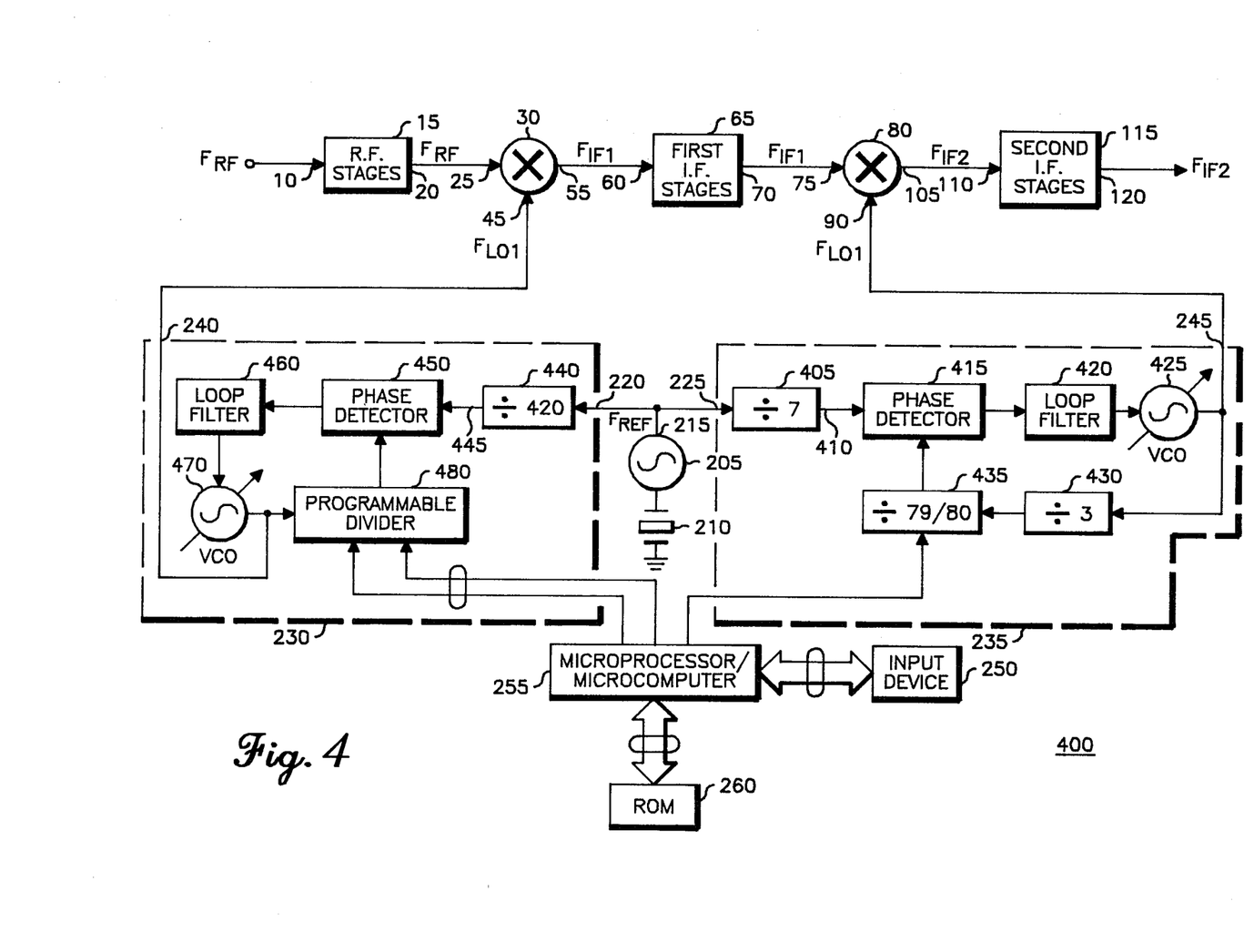
FIG. 4 shows a system block diagram of a preferred embodiment of the receiver system of the present invention.

One embodiment of the present invention, which may be utilized for example in the UHF band, is shown in FIG. 4 as receiver system 400. This synthesized receiver system may be utilized to generate any receiver frequency between 403 Mhz and 520 Mhz in 5 Khz steps. The following system frequencies are utilized in system 400:

$F_{REF} = 2.1$ Mhz $F_{IF1} = 71.55$ Mhz $F_{IF2} = 450.0$ Khz $F_{LO2} = 71.1$ Mhz (low-side injection) or 72.0 Mhz (high-side injection).

In system 400 the reference oscillator 205 generates a stable reference frequency $F_{REF}$ of 2.1 Mhz. It will be evident to those skilled in the art that this reference frequency is not unique and many others may be used in practicing the present invention. This reference frequency is applied to input 225 of synthesizer 235 (shown enclosed in broken lines). The reference frequency $F_{REF}$ is divided in frequency divider 405 by a factor of 7 to give a frequency of 300 kHz at output 410 of divider 405. The value 300 kHz in this instance is selected because the difference between the high-side injection frequency for the second mixer 80 and the low-side injection frequency for second mixer 80 is 900 kHz; and 900 kHz is dividable by 300 kHz an integral number of times (3).

This signal is then applied to the frequency multiplier portion of the second local oscillator synthesizer which includes phase detector 415, loop filter 420, VCO 425, fixed divider 430 (sometimes called a pre-scaler) and programmable divider 435 the series combination of dividers 430 and 435 result in a total frequency multiplication factor of $3 \times 79 = 237$ or $3 \times 80 = 240$ depending upon the programming of divider 435. Therefore, the 300 kHz signal present at output 410 of divider 405 is multiplied by a factor of either 237 or 240 to give output frequencies at second local oscillator synthesizer 245 of either 300 kHz $\times$ 237 = 71.1 MHz for low-side injection or 240 $\times$ 300 kHz = 72.0 MHz for high-side injection. The divisor of divider 435 can be incremented or decremented by 1 in accordance with the instructions from the microprocessor 255.

In a somewhat similar manner, the reference frequency $F_{REF}$ is applied to the input of a fixed divider 440 which divides the reference frequency $F_{REF}$ by a factor of 420. This divisor is selected in order to provide the step size of 2.1 MHz/420 = 5 kHz at a divider output 445. If, for example, instead of 5 kHz spacing a 6.25 kHz spacing where desired the divisor of divider 440 could be changed to 336.

This 5 kHz signal at output 445 is then applied to the frequency multiplier circuit which includes phase detector 450, loop filter 460, VCO 470 and programmable divider 480. In this instance, the dividing factor selected for programmable divider 480 may for example have a divider ranging anywhere from 66,270 to 89,690. This allows first local oscillator synthesizer 230 to generate low-side injection frequencies ranging from 331.45 MHz to 448.45 or 42 MHz. This range of frequencies for $F_{LO1}$ allows the receiver to operate anywhere from 403 MHz to 520 MHz utilizing a single frequency synthesizer and without receiver self-quieting. Although this range of frequencies may require band-splitting of the RF stages to handle such a wide range, many channels which would ordinarily be hindered by self-quieting will now be accessible to a user in addition to those channels which are normally attainable by conventional receiver disigns.

Consider now an example of how the present system enhances frequency stability. To clearly point out this advantage, consider a UHF receiver system designed in a manner similar to that of receiver 400 as contrasted with a conventional receiver as in FIG. 1 and assume the following system parameters:

$F_{LO1} = 450$ MHz $F_{IF1} = 70$ MHz $F_{IF2} = 450$ kHz $F_{LO2} = 69.550$

Assuming the first local oscillator has a frequency stability of 25 PPM (Parts Per Million) and the second local oscillator has a frequency stability of 20 PPM. The total frequency drift $\Delta F$ for the system of FIG. 1 is given by:

$\Delta F = 2.25$ kHz $+ 1.39$ kHz $= 3.64$ kHz.

In this case the 2.25 kHz drift is the result of the 5 PPM stability of the first oscillator and the 1.39 kHz drift is the result of the 20 PPM stability of the second oscillator. The resultant 3.64 kHz drift could cause serious problems in a receiver with a narrow-band I.F. filter that requires a low distortion output as one skilled in the art will readily appreciate.

In the case of system 400, both local oscillators may be slaved to a single 5 PPM reference oscillator resulting in a total frequency drift of:
$\Delta F = 2.25$ kHz $+ 0.35$ kHz $= 2.6$ kHz.

Thus, for system 400 a 29% reduction in frequency drift results. In order to achieve similar results with the system of FIG. 1, a 5 PPM second oscillator crystal would be necessary. This would substantially increase the cost of the receiver. Since most of the synthesizer circuitry of system 400 may be readily integrated on a single integrated circuit, the cost of implementation of such a circuit would be low and substantial size reduction over the prior art would be attained.

It will be evident to those skilled in the art that any number of techniques may be utilized to program programmable dividers 435 and 480. FIG. 4 and FIG. 2 show one technique wherein information from ROM 260 is transferred through microprocessor 255 to programmable dividers 435 and 480. FIGS. 2 and 4 also show parallel lines of information driving programmable divider 480. These restrictions are not intended to be limiting since it is evident that dividers 435 and 480 may include digital latches for storing serial information provided momentarily from microprocessor 255. In the alternative, ROM 260 may have an appropriate number of its output lines coupled directly to programmable dividers 435 and 480 in order to provide those dividers with the necessary programming. In fact, simpler receivers may choose not to utilize microprocessor 255 at all. These simpler designs would access ROM 260 directly with input device 250 and ROM 260 would directly control the programable dividers.

As microprocessors and microcomputers become a more important part of communications transceivers, they will be called upon to do many tasks presently performed by hardware systems. Such tasks include monitoring of battery status, coded squelch receiver options, etc. As such, ROM 260 may be called upon to store large quantities of information to be utilized by microprocessor 255 in supporting radio functions perhaps unrelated to the programming of first local oscillator synthesizer 230 and second local oscillator synthesizer 235. ROM 260 may be programmed by the process outline in the flow chart of FIG. 5 as described below.

Figure 5:
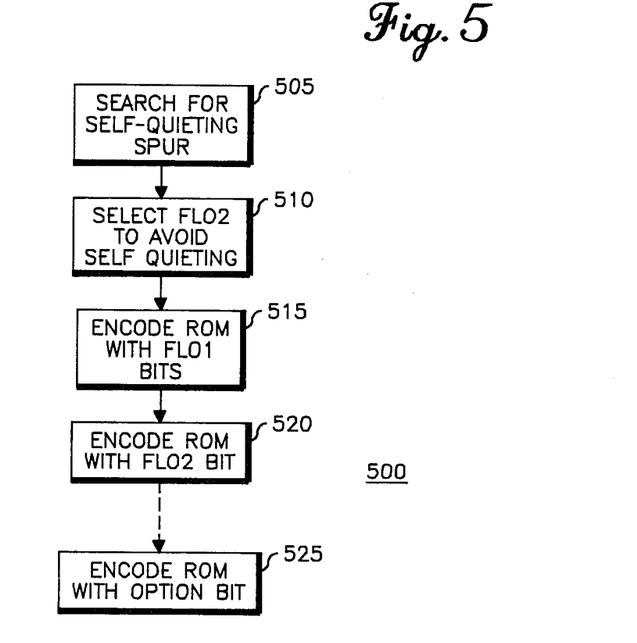
FIG. 5 shows a flow chart for the process of programming the ROM of FIG. 2 and FIG. 4.

The process of flow chart 500 begins with a search for self-quieting spurious responses at block 505. This self-quieting spurious search may be accomplished in any number of ways. Perhaps the most reliable and logical technique is to perform a computer search for each frequency interest to be encoded in a particular radio while another technique would utilize a look-up table. A computer search may include the steps of computing the sum and difference of all possible combination of harmonics of both the first and second local oscillator frequency for both high and low side injection (out to a reasonable number of harmonics, perhaps as many as 20 to 25, of the oscillator frequencies). The results of these computations can then be compared with the frequency bands which may pass through each of the first and second I.F. stages. The second I.F. frequency which has the best potential for not having a self-quieting spurious problem, or the one that has no potential for self-quieting spurious responses may then be selected at step 510 to avoid self-quieting.

It should be noted that only certain combinations of I.F. and local oscillator frequencies will result in any self-quieting spurious problem at all. One skilled in the art will appreciate, however, that wideband receiver systems will exhibit a greatly increased likelihood of experiencing receiver self-quieting than prior narrowband systems. A number of frequencies will not exhibit a problem regardless of whether high side injection or low side injection is utilized in the second oscillator. In this case, $F_{LO2}$ may be selected at random or according to any other selection criteria if high-side or low-side injection is desirable for any other reason.

At step 515 the ROM is encoded with an appropriate number of bits necessary to establish the frequency of the first oscillator synthesizer $F_{LO1}$ in order to receive the desired frequency. At step 520 the bit which determines whether $F_{LO2}$ is to be high side injection or low side injection is encoded into the ROM. At step 525 any optional information which may be desirable to encode into the ROM such as, coded squelch options, etc. is encoded.

While flow chart 500 shows steps 515, 520, and 525 as distinct process steps, it may be desirable to burn or otherwise encode these bits into the ROM simultaneously, 1 bit at a time, or in any other particular order which may prove advantageous as necessitated by the ROM architecture, programmer, etc.

Figure 6:
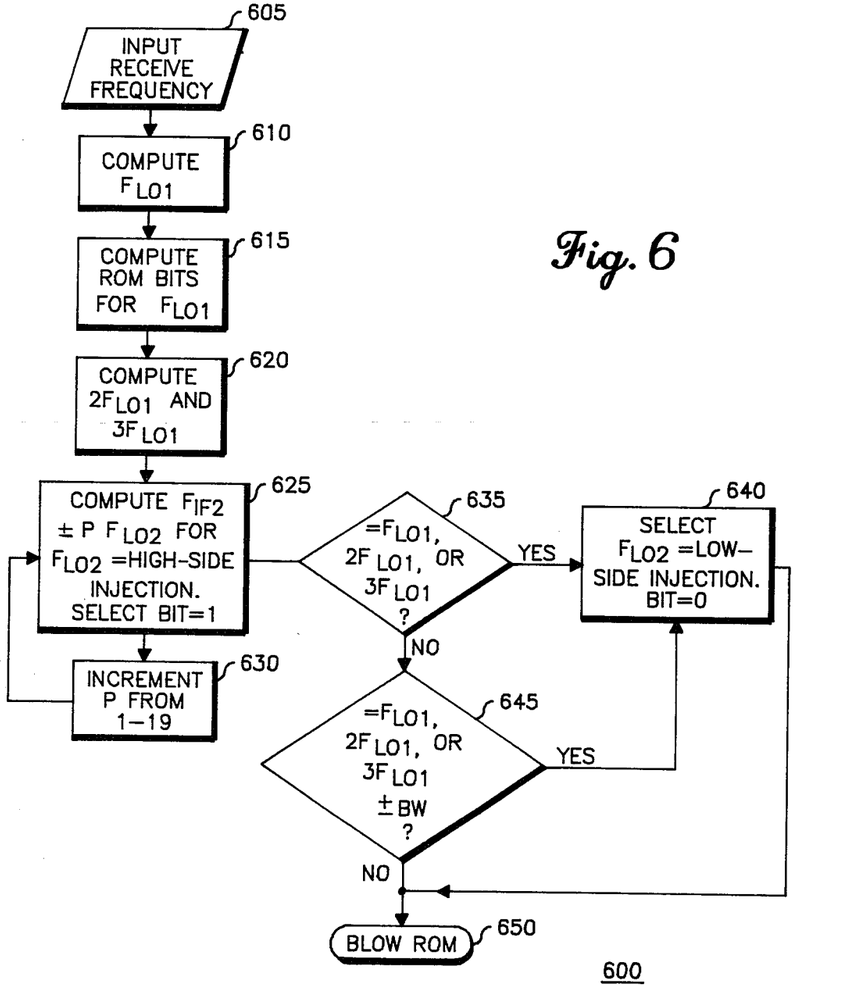
FIG. 6 shows a detailed flow chart for a preferred programming process for the ROM of FIG. 2 and FIG. 4.

In most instances, receiver self-quieting results from a low order harmonic (first through about third) of the first local oscillator mixing with a higher order harmonic (up to about nineteenth) of the second local oscillator frequency. For these cases a detailed ROM burning procedure 600 as shown in FIG. 6 may be utilized. In procedure 600 a receive frequency is entered at step 605. The correct first local oscillator frequency is computed or looked up at a step 610. At a step 615 the appropriate ROM bits for encoding an oscillator with the necessary information to produce $F_{LO1}$ are computed or otherwise generated. The values of the second and third harmonics of $F_{LO1}$ are computed and stored at a step 620.

Steps 625 and 630 form a loop which computes the values of $F_{IF2} \pm (P \times F_{LO2})$, where P is an integer incremented in step 630, assuming a high-side injection $F_{LO2}$ is utilized. In this system the value of the bit determining high-side or low-side injection at the second mixer is set to be 1 for high-side or 0 for low-side injection. Since high-side injection is randomly selected at step 625, Bit=1 is also chosen. In step 630 the value of P is incremented from 1 to 19 the step 625 makes its computation for each value of P.

At step 635 each of the values computed in step 625 is inspected to see if it is equal to the first, second, or third harmonic of $F_{LO1}$. If they are equal, low-side injection and Bit=0 is selected in step 640. If they are not equal, step 645 inspects to see if the values computed in step 625 are within the I.F. bandwidth of the system. If so step 640 selects low-side injection and Bit=0. If not the ROM is encoded with Bit=1 and the $F_{LO1}$ bits. If the flow has passed through step 640, Bit=0 and the $F_{LO1}$ bits are encoded.

A receiver designed in accordance with the above considerations not only results in a receiver having improved stability and no receiver self-quieting spurious responses, but in addition the manufacture of the receiver is simplified considerably. Presently, radio receivers are often manufactured only to the subassembly stages due to the practically infinite number of combinations of options, frequencies, etc. that may be required by a particular user. Therefore, the typical user of two-way portable radios may be unable to purchase his radio "over the counter". By encoding ROM 260 with all of the appropriate information necessary to shape the "personality" of a particular receiver, entire transceivers or receivers may be manufactured from start to finish with the exception of installing ROM 260. A user's receiver requirements can therefore be met almost instantaneously or changed as needed by simply encoding ROM 260 or replacing it with a different ROM. The net effect is a more efficient manufacturing process and a process which lends itself to mass production much more readily than was obtainable by transceivers in the past.

While the receiver systems discussed herein have switched the second local oscillator frequency between high and low-side injection to implement the present invention it is clear that any of the local oscillators of a multiple conversion receiver system may be treated accordingly. It may even be advantageous to practice the present invention with more than one of the local oscillator frequencies when more than two frequency conversions are utilized. While the preferred embodiment always utilizes the lowest frequency local oscillator due to the relative ease of changing its frequency compared to other oscillators in a given system, the present invention is not to be restricted to that embodiment.

Thus, it is apparent that in accordance with the present invention, a method and apparatus that fully satisfies the objects, aims and advantages is set forth above. While the invention has been described in conjunction with several specific embodiments, it is evident to those skilled in the art that many alternatives, modifications, and variations will be apparent in light of the foregoing description. Accordingly, it is intended that the present invention embrace all such alternatives, modifications, and variations as fall within the spirit and broad scope of the appended claims.

What is claimed is:

1. A multiple conversion superheterodyne receiver system, comprising:
   first local oscillator means for selectively generating any one of a plurality of predetermined first local oscillator frequencies to be mixed with an incoming signal to produce a first intermediate frequency;
   second local oscillator means for selectively generating any one of two second local oscillator frequencies to be mixed with said first intermediate frequency to produce an appropriate second intermediate frequency, one of said two second local oscillator frequencies constitutes a high side injection frequency and the other of said two frequencies constitutes a low side injection frequency; and frequency selecting means, operatively coupled to said first and second local oscillator means, for selecting one of said first local oscillator frequencies to tune said receiver to a desired channel and means for selecting an appropriate one of said two second local oscillator frequencies in response to the tuning of said receiver to the desired channel for avoiding self-quieting spurious responses in said receiver system.

2. The receiver system of claim 1, further including:

a reference oscillator for providing a reference frequency; and wherein said first local oscillator means includes a first frequency synthesizer operatively coupled to said reference oscillator; and wherein said second local oscillator means includes a second frequency synthesizer operatively coupled to said reference oscillator, whereby a single reference oscillator ultimately provides an input to both the first and second frequency synthesizers thereby enhancing frequency stability.

3. The receiver system of claim 2, wherein said first and second frequency synthesizers include first and second programmable frequency synthesizers respectively and wherein said frequency selecting means includes storage means for storing programming information for said programable frequency synthesizers.

4. The receiver system of claim 3 wherein said storage means includes a ROM.

5. A multiple conversion superheterodyne receiver system, comprising:

a plurality of cascaded frequency mixers arranged to provide multiple frequency conversion of an incoming frequency corresponding to a predetermined channel;

means for selecting said predetermined channel;

a plurality of frequency generators each coupled to one of said mixers for providing an injection frequency to each of said mixers, each injection frequency constituting either high side or low side injection; and means for altering one of said injection frequencies between high and low side injection in response to the selection of said predetermined channel to avoid receiver self-quieting.

6. The receiver system of claim 5 wherein said plurality of frequency generators includes a frequency generator for generating a lowest injection frequency and wherein said altering means includes means for altering said lowest injection frequency.

7. The receiver system of claim 6 wherein at least one of said frequency generators includes a frequency synthesizer.

8. The receiver system of claim 7 further including a reference oscillator coupled to said frequency synthesizer.

9. The receiver system of claim 8 wherein said frequency synthesizer includes a programmable divider and said altering means includes means for changing the divisor of said programmable divider.

10. A synthesized multiple conversion receiver system, comprising:

a reference oscillator;

a first frequency synthesizer, operatively coupled to said reference oscillator, for generating a plurality of first injection frequencies;

a first mixer operatively coupled to said first injection frequency with an input frequency to produce a first intermediate frequency;

a second frequency synthesizer operatively coupled to said reference oscillator for generating either a high side or a low side second injection frequency;

a second mixer operatively coupled to said second frequency synthesizer and said first mixer for mixing said first intermediate frequency with one of said second injection frequencies;

said first and second mixers provide multiple conversion of an incoming frequency corresponding to a predetermined channel;

means for selecting said predetermined channel; and means for programming said second frequency synthesizer to generate an appropriate one of said second injection frequencies in response to the selection of said predetermined channel for avoiding receiver self-quieting spurious responses.

11. The receiver system of claim 10, wherein said reference oscillator includes a crystal controlled oscillator.

12. The receiver system of claim 11, wherein said programming means includes a ROM.

* * * * *